United States Patent
Mun

(10) Patent No.: US 8,924,635 B2
(45) Date of Patent: Dec. 30, 2014

(54) MEMORY CONTROLLER AND METHOD OF OPERATING THE SAME, AND MEMORY SYSTEM INCLUDING THE SAME

(75) Inventor: Kui-Yon Mun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 316 days.

(21) Appl. No.: 13/450,708

(22) Filed: Apr. 19, 2012

(65) Prior Publication Data

US 2012/0331205 A1   Dec. 27, 2012

(30) Foreign Application Priority Data

Jun. 24, 2011   (KR) .......................... 10-2011-0061436

(51) Int. Cl.
*G06F 12/00* (2006.01)
*G06F 13/00* (2006.01)
*G06F 13/28* (2006.01)
*G06F 12/02* (2006.01)
*G11C 16/34* (2006.01)

(52) U.S. Cl.
CPC .... *G06F 12/0246* (2013.01); *G06F 2212/7204* (2013.01); *G11C 16/349* (2013.01)
USPC .......................................... 711/103; 711/154

(58) Field of Classification Search
CPC .................... G06F 12/0246; G06F 2212/7211; G11C 16/349; G11C 16/3418
USPC .......................................... 711/102–103, 154
See application file for complete search history.

(56) References Cited

U.S. PATENT DOCUMENTS

| | | |
|---|---|---|
| 2005/0281088 A1 | 12/2005 | Ishidoshiro et al. |
| 2007/0036001 A1 | 2/2007 | Kanda et al. |
| 2009/0198869 A1* | 8/2009 | Mosek ............. 711/103 |
| 2010/0077132 A1* | 3/2010 | Hung ............... 711/103 |
| 2010/0124122 A1 | 5/2010 | Jeong et al. |
| 2010/0128537 A1 | 5/2010 | Suhail et al. |
| 2010/0329010 A1* | 12/2010 | Dong ............ 365/185.17 |
| 2011/0131367 A1* | 6/2011 | Park et al. ........ 711/103 |

FOREIGN PATENT DOCUMENTS

| | | |
|---|---|---|
| JP | 2007-035214 | 2/2007 |
| KR | 1020100054705 | 5/2010 |

* cited by examiner

*Primary Examiner* — Ryan Bertram
(74) *Attorney, Agent, or Firm* — Myers Bigel Sibley & Sajovec, P.A.

(57) ABSTRACT

A method for operating a memory controller is disclosed. The method includes receiving data output from a memory block of a non-volatile memory device and changing erase count of the memory block based on the received data.

20 Claims, 12 Drawing Sheets

| Charge Loss | Decreased Erase Count |
|---|---|
| 50mV | -10 |
| 100mV | -30 |
| 150mV | -50 |
| 200mV | -100 |

FIG.3

| Charge Loss | Decreased Erase Count |
|---|---|
| 50mV | −10 |
| 100mV | −30 |
| 150mV | −50 |
| 200mV | −100 |

MEMORY CONTROLLER AND METHOD OF OPERATING THE SAME, AND MEMORY SYSTEM INCLUDING THE SAME

CROSS-REFERENCE TO RELATED APPLICATIONS

This application claims priority under 35 U.S.C. §119(a) from Korean Patent Application No. 10-2011-0061436, filed on Jun. 24, 2011, the disclosure of which is hereby incorporated herein by reference.

BACKGROUND

Example embodiments of inventive concepts relates to the field of electronics, and particularly, to memory controllers.

A non-volatile memory device may retain data stored thereon even if the external power supply is cut off. For example, a flash memory device is a non-volatile memory device that can be electrically programmed and erased. Flash memory devices may be divided into NAND-type flash memory and NOR-type flash memory.

The flash memory device can perform erase operations in units of blocks and can perform programming operations and read operations in units of pages. The lifespan of a flash memory device may be specified by a program/erase cycle (P/E cycle) count.

SUMMARY

The inventive concept provides a method for operating a memory controller including receiving data output from a memory block of a non-volatile memory device and changing erase count of the memory block based on the received data.

When the received data is a read data, the changing erase count includes determining whether or not charge loss has occurred by analyzing the read data, calculating charge loss amount when it is determined that charge loss has occurred, and changing the erase count of the memory block based on the calculated charge loss amount.

When the received data is a data including a parameter, the changing erase count includes determining whether or not charge loss has occurred, and changing the erase count of the memory block when it is determined that charge loss has occurred.

The data including the parameter may include at least one of cell state of the non-volatile memory device, program loop count, erase loop count, error bit count, and erase count.

The data including the parameter may be stored in a memory block of the non-volatile memory device.

The information on the changed erase count may be stored in a memory included in the memory controller.

After the changing erase count, the information on the changed erase count may be stored at the memory block of the non-volatile memory device.

The inventive concept provides a memory system including a non-volatile memory device and a memory controller controlling the operation of the non-volatile memory device, and the memory controller receives data output from a memory block of the non-volatile memory device and changes erase count of the memory block based on the received data.

The information with respect to the changed erase count may be stored in a memory included in the memory controller.

The memory controller and the non-volatile memory device may be embodied as one package.

The memory system may be a memory card or a solid state drive (SSD).

The information with respect to the changed erase count may be output into the non-volatile memory device to be stored in the non-volatile memory device.

BRIEF DESCRIPTION OF THE DRAWINGS

Example embodiments of the inventive concept will be more clearly understood from the following detailed description taken in conjunction with the accompanying drawings in which:

FIG. 3 is a diagram for showing decreasing erase count according to charge loss amount;

DETAILED DESCRIPTION OF EMBODIMENTS ACCORDING TO THE INVENTIVE CONCEPT

Figure 1:
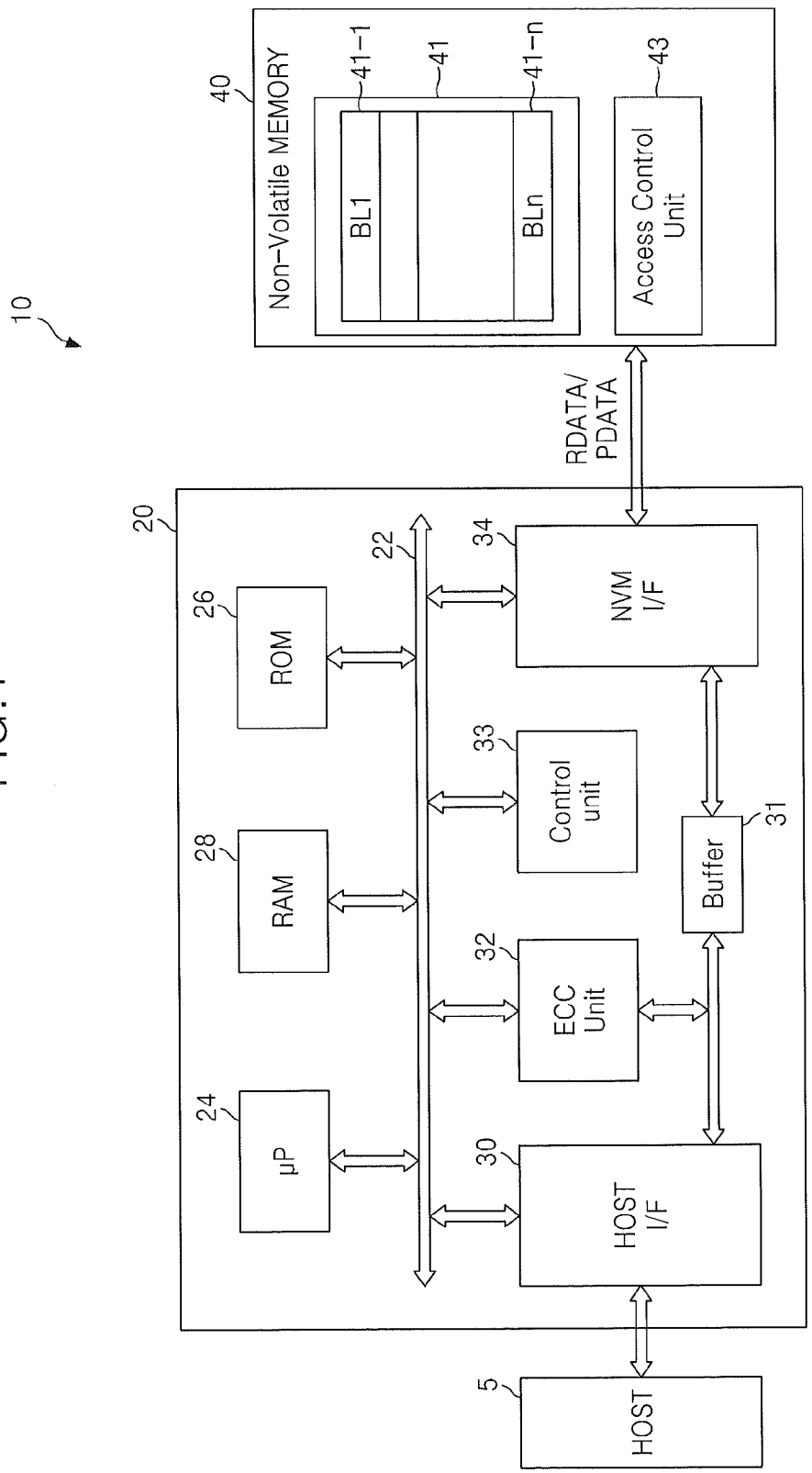
FIG. 1 is a block diagram of a memory system according to an example embodiment of the inventive concepts.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory system according to an example embodiment of the inventive concept. Referring to FIG. 1, the memory system 10 includes a memory controller 20 and a non-volatile memory device 40. The memory system 10 may further be coupled to a host 5.

The memory system 10 may be a personal computer (PC), portable computer, mobile phone, smart phone, tablet PC, personal digital assistant (PDA), portable multimedia player (PMP), GPS automotive navigation systems, MP3 players, audio equipment, television, digital camera, or camcorder.

The memory controller 20 and the non-volatile memory device 40 may be embodied as one package, for example, a multi-chip package. Although one non-volatile memory device 40 is illustrated in FIG. 1 for convenience of explanation, the memory controller 20 may control the operation of a plurality of non-volatile memory devices.

The memory controller 20 may control data processing operations of a non-volatile memory device, such as, program operation, read operation, and erase operation, according to the control of the host 5.

The memory controller 20 includes a microprocessor 24, a read only memory (ROM) 26, a random access memory (RAM) 28, a host interface 30, an error correction code (ECC) unit 32, a control unit 33, and a non-volatile memory interface 34. In some embodiments, there may be included a buffer between the host interface 30 and the non-volatile memory interface 34. The buffer 31 may be implemented as a page buffer, which may temporally store data that the host 5 and the non-volatile memory device exchange.

The microprocessor 24, the ROM 26, the RAM 28, the host interface 30, the ECC unit 32, and the non-volatile memory interface 34 may be connected to each other through a bus 22 and exchange data.

The microprocessor 24 may execute programs stored on the ROM 26. The ROM 26 may store the programs executed by the microprocessor 24. For example, ROM 26 may store programs enabling to control or manage the host interface 30, the ECC unit 32, or the non-volatile memory interface 34.

The RAM 28 may temporally store programs executed by the microprocessor 24. For example, programs stored on the ROM 26 may be loaded in the RAM 28 under the control of the microprocessor 24.

The host interface 30 provides an interface for communicating between the host 5 and the microprocessor 24 under the control of the microprocessor 24. For example, the interface may be advanced technology attachment (ATA) interface, serial ATA interface, parallel ATA interface, or small computer system interface (SCSI).

Figure 2:
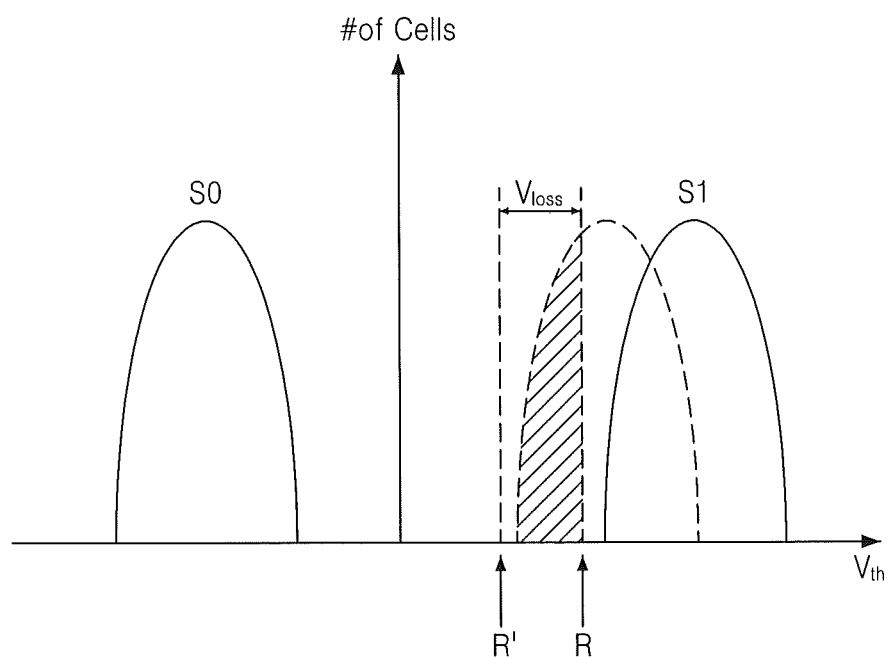
FIG. 2 is a diagram for showing decrease of a threshold voltage of a memory cell included in the memory cell array shown in FIG. 1 due to charge loss.

The control unit 33 analyzes read data RDATA received from one of memory blocks 41-1-41-$n$ of the non-volatile memory device 40, for example, a page of a first memory block 41-1, determines whether or not charge loss has occurred according to the result of analysis, calculates charge loss amount $V_{loss}$ of FIG. 2 when it is determined that charge loss has occurred, and changes erase count of the first memory block 41-1 according to the calculated charge loss amount $V_{loss}$ of FIG. 2.

In some embodiments, the control unit 33 receives program data or erase data from the non-volatile memory 40, determines whether or not charge loss has occurred by analyzing status data of the non-volatile memory device 40 included in the received program data or erase data, and changes erase count of the first memory block 41-1 having undergone charge loss, when it is determined that charge loss has occurred.

In some embodiments, the control unit 33 analyzes the received read data using an error correction code (ECC) generated by the ECC unit 32 and determines whether or not charge loss has occurred.

FIG. 2 is a diagram showing decrease of a threshold voltage of a memory cell included in the memory cell array shown in FIG. 1. The horizontal axis of FIG. 2 represents the threshold voltage $V_{th}$, and the vertical axis represents the number of the memory cells.

FIG. 2 shows the case of single level cell for convenience of explanation, but it is also applicable to the case of multi level cell.

Referring to FIG. 2, the control unit 33 calculates the difference between the default pass voltage R when read failure occurred and the pass voltage R' is adjusted until read pass and calculates charge loss amount $V_{th}$, which is the value of the difference, based on the result of determination. In some embodiments according to the inventive concept, the pass voltage R' is adjusted until an acceptable (non-zero) number of errors occurs during the read, such as in embodiments where the read data is protected by ECC so that a limited number of bit errors may be detected and corrected during the read operation.

In some embodiments, the control unit 33 may calculate the charge loss amount $V_{loss}$ based on the number of 0 or 1 of memory cells in the page where the read failure is occurred.

In some embodiments, the control unit 33 compares patterns of the read data RDATA received from the page of the first memory block 41-1 of the non-volatile memory device 40 and data which is programmed to the page and calculates charge loss amount $V_{loss}$ based on the comparison.

The control unit 33 calculates charge loss amount $V_{loss}$ (using, for example, one of the approaches described herein) and changes the erase count of the first memory block 41-1 according to the calculated charge loss amount $V_{loss}$. The ways for calculating the charge loss amount $V_{loss}$ are not restricted to the above ways.

The control unit 33 may receive data PDATA including a parameter. The control unit 33 may determine whether or not charge loss has occurred by analyzing the received data PDATA including a parameter and change erase count of the first memory block 41-1 when it is determined that charge loss has occurred.

The data PDATA including a parameter may include at least one of cell state of the non-volatile memory device 40, program loop count, erase loop count, error bit count, and erase count.

FIG. 3 illustrates erase count decreasing according to charge loss amount $V_{loss}$. The values of FIG. 3 are set arbitrarily for convenience of explanation, and the erase count decreasing according to the charge loss amount $V_{loss}$ may be set by statistical values.

Referring to FIG. 1 through FIG. 3, if it is assumed that erase count of a block is 100 in the basis of the default pass voltage R of 0 mV, and the newly set pass voltage R' is −100 mV, charge loss amount $V_{loss}$ becomes 100 mV, which is the difference between the default pass voltage R and the newly set pass voltage R'. The erase count corresponding to 100 mV in FIG. 3 is −30, the present erase count is changed into 70 which is 100 minus 30. Therefore, since the erase count with respect to the first memory block 41-1 is changed from 100 into 70, the first memory block 41-1 may perform program and/or erase 30 times thereafter.

Here, a data CDATA including the changed erase count may be stored in a memory controller 20. For example, the data CDATA may be stored in RAM 28 which are included in the memory controller 20.

In some embodiments, the data CDATA including information of the changed erase count may be stored in a spare region or a spare block of the first memory block 41-1 of the non-volatile memory device.

TABLE 1

| Erase Loop Count | Program Loop Count | The number of Initial Program Error Bit | Erase Count |
|---|---|---|---|
| ELC1 | PLC1 | 4 | 50 |
| ELC2 | PLC2 | 10 | 100 |

Referring to Table 1, another example embodiment of changing erase count may change the erase count according to erase loop count/program loop count by applying incremental step pulse program (ISPP)/incremental step pulse erase (ISPE) in case of erasing and/or programming. For example, it is assumed that erase count of a corresponding block is presently 100 times. If erase loop count is ELC1 when erasing the corresponding block, the erase count mat be corrected into 50 times. For another example, it is assumed that erase count of a corresponding block is presently 100 times. If program loop count is ELC1 when programming the corresponding block, the erase count may be corrected into 50 times.

In some embodiments according to the inventive concept, the CDATA shown in Table 1 can be maintained during operations and/or testing of the non-volatile memory device, and updated when a new erase count value is determined. For example, if a loss of charge condition is detected in a block, (leading to detected errors) a pass voltage level can be determined for use in subsequent read operations of the same block. Moreover, the new erase count can be determined for the block based on the amount of charge loss that is detected. For example, if the charge loss of the block is determined to be about 50 mV, the new pass voltage can be reduced by about 50 mV for future reads and the erase count can be changed by 10 so that the block can be accessed more than would otherwise be allowed because the new (lower) pass voltage used for reading the block has allows for the charge loss in that block.

A mapping table with the above is maintained. In some embodiments, erase count may be changed according to the error level when a programmed data is read again after programming.

The non-volatile memory interface 34 provides an interface for communicating between the microprocessor 24 and the non-volatile memory 40 under the control of the microprocessor 24. When the non-volatile memory 40 is implemented as a NAND flash memory, the interface 34 may be implemented as a NAND flash memory interface.

Here, an interface denotes hardware for communicating data or hardware, for communicating data, in which firmware is embedded.

The non-volatile memory device 40 includes a memory cell array 41 and an access control unit 43 capable of accessing the memory cell array 41.

The memory cell array 41 includes a plurality of memory cells each capable of storing 1-bit or more. Each of the plurality of memory cells is connected to each of a plurality of bit lines and each of a plurality of word lines.

When each of the memory cells is embodied as a single level cell (SLC), a page is the smallest unit capable of being programmed and denotes an assembly of the memory cells which are connected to a word line. When each of the plurality of memory cells is embodied as a multi level cell (MLC), the multi level cell (MLC) has data of the same number with the number of bit programmed on each of the memory cells.

The block 41 is the smallest unit capable of being erased and denotes an assembly of pages. The access control unit 43 controls the non-volatile memory device so as to perform program operation, read operation, or erase operation in response to control signals provided from the memory controller 20.

Figure 4:
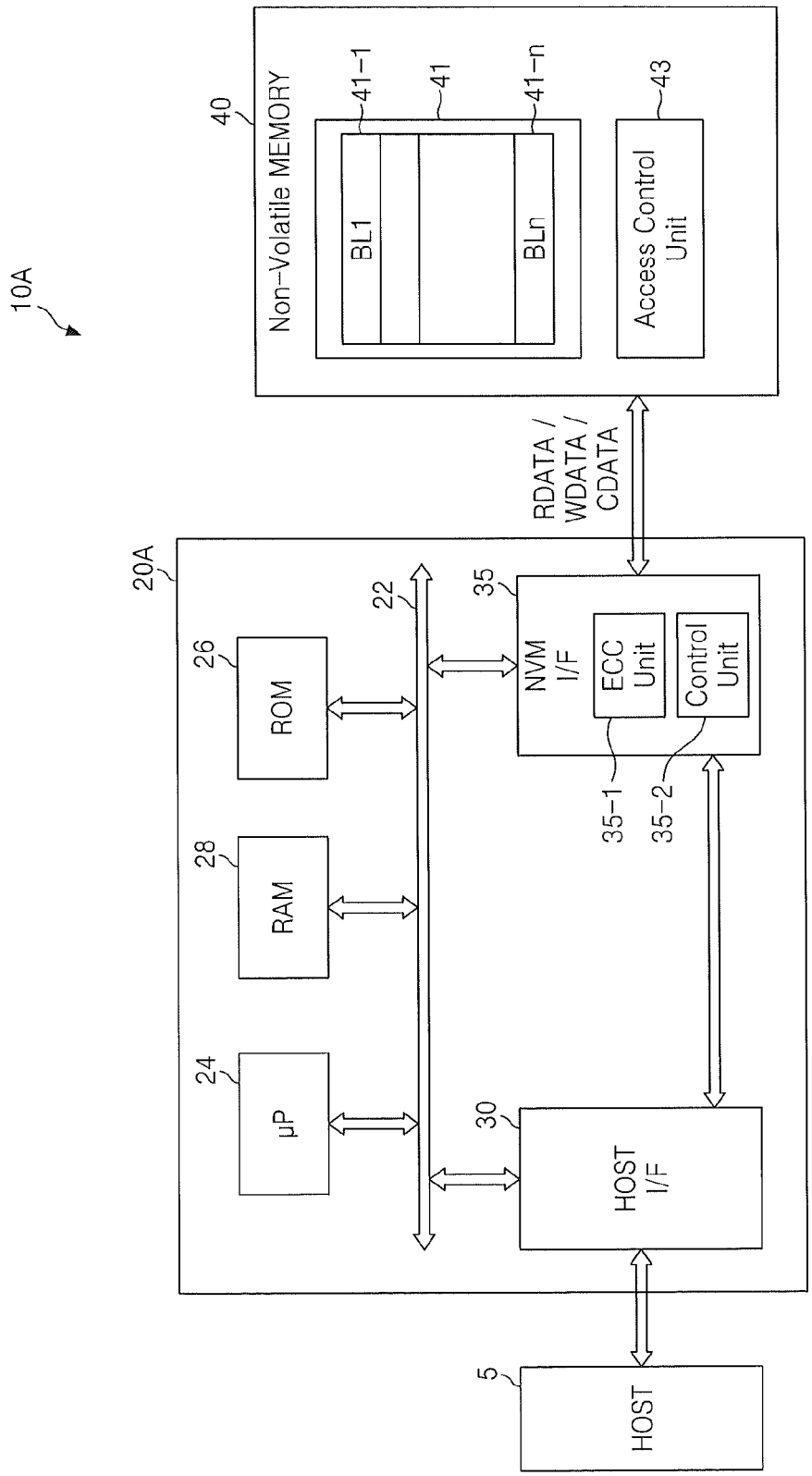
FIG. 4 is a block diagram of a memory system according to another example embodiment of the inventive concept.

FIG. 4 is a block diagram of a memory system according to another example embodiment of the inventive concept. Referring to FIG. 4, a memory controller 20A has the same structure as the memory controller shown in FIG. 1 except that an ECC unit 35-1 and a control unit 35-2 are included in a non-volatile memory interface 35. Therefore, descriptions of the same drawing references will be omitted.

The ECC unit 35-1 performs the same function as the ECC unit 32 shown in FIG. 1, and the control unit 35-2 performs the same function with the control unit 33 shown in FIG. 1.

Figure 5:
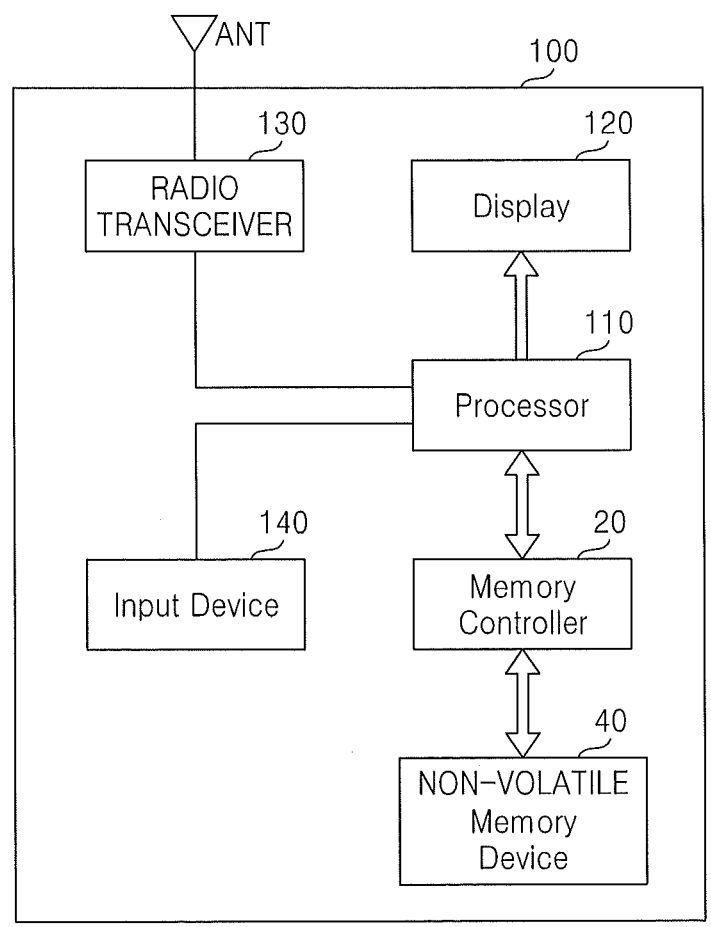
FIG. 5 is a block diagram of a memory system according to yet another example embodiment of the inventive concept.

FIG. 5 is a block diagram of a memory system according to yet another example embodiment of the inventive concepts. Referring to FIG. 5, the memory system 100 may be implemented as cellular phone, smart phone, personal digital assistant (PDA), or wireless communication device.

The memory system 100 includes a non-volatile memory device 40 and a memory controller 20 controlling operation of the non-volatile memory device 40. The memory controller 20 may control the data access operation of the non-volatile memory device 40, for example, program operation, erase operation, or read operation, under the control of a processor 110.

Also, the memory controller 20 analyzes read data RDATA received from the non-volatile memory device 40, determines whether charge loss has occurred or not according to the result of analysis, calculates charge loss amount $V_{loss}$ when it is determined that charge loss has occurred, and changes an erase count of a memory block including the read data RDATA.

A page of data programmed in the non-volatile memory device 40 may be displayed through a display 120 under the control of the processor 110 and the memory controller 20.

The radio transceiver 130 may transmit/receive radio signals through an antenna ANT. For example, the radio transceiver 130 may convert a radio signal received through the antenna ANT into a signal to be processed in the processor 110.

Therefore, the processor 110 may process a signal output from the radio transceiver 130 and transmit the processed signal to the memory controller 20 or the display 120. The memory controller 20 may program the signal processed by the processor 110 in the memory device.

Also, the radio transceiver 130 may convert a signal output from the processor 110 into a radio signal and output the converted radio signal through the antenna ANT.

The input device 140 is a device enabling input of a control signal to control the operation of the processor 110 or data to be processed by the processor 110 and may be implemented as a pointing device such as touch pad and computer mouse, a key pad, or a keyboard.

The processor 110 may control the operation of the display 120 to display data output from the memory controller 20, data output from the radio transceiver 130, or data output to the input device 140. The memory controller controlling the operation of the non-volatile memory device 40 may be embodied as a part of the processor 110 and also as another chip separate from the processor 110.

Figure 6:
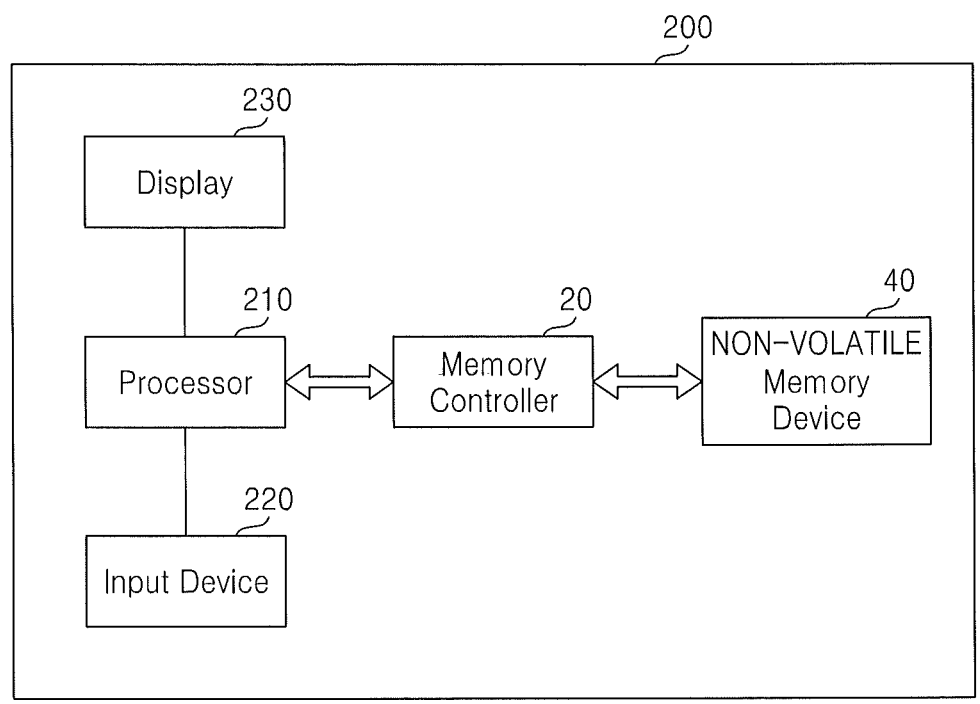
FIG. 6 is a block diagram of a memory system according to still yet another example embodiment of the inventive concept.

FIG. 6 is a block diagram of a memory system according to still yet another example embodiment of the inventive concept. Referring to FIG. 6, the memory system 200 may be implemented as personal computer (PC), tablet PC, net-book, e-reader, personal digital assistant (PDA), portable multimedia player (PMP), MP3 player or MP4 player.

The memory system 200 includes a non-volatile memory device 40 and a memory controller 20 capable of controlling the data processing operation of the non-volatile memory device 40.

The processor 210 may display data stored in the non-volatile memory device through a display 230 according to data input through an input device 220. For example, the input device 220 may be implemented as a pointing device such as a touch pad or a computer mouse, a keypad, or a keyboard.

The processor 210 may control the general operation of the memory system 200 and the operation of the memory controller 20.

The memory controller 20 controlling the operation of the non-volatile memory device 40 may be embodied as a part of the processor 210 or separate from the processor 210.

The memory controller 20 analyzes read data RDATA received from the non-volatile memory device 40, determines whether charge loss has occurred or not according to the result of analysis, calculates charge loss amount $V_{loss}$ when it is determined that charge loss has occurred, and changes erase count of a memory block including the read data RDATA.

Figure 7:
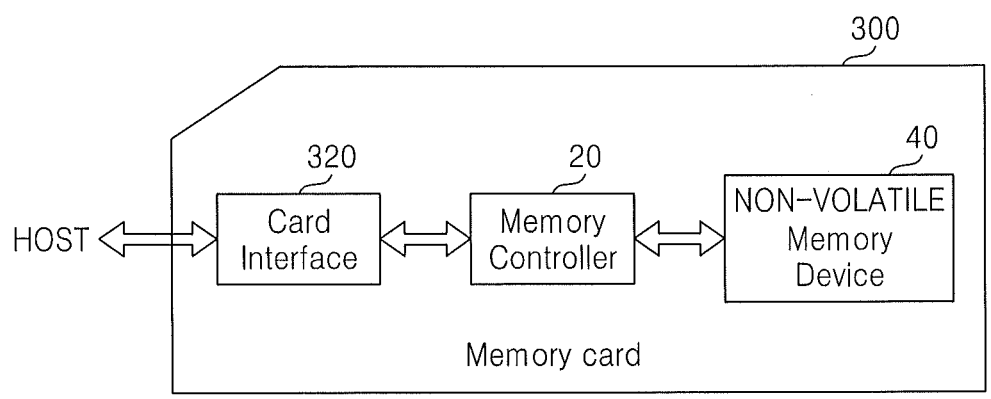
FIG. 7 is a block diagram of a memory system according to still yet another example embodiment of the inventive concept.

FIG. 7 is a block diagram of a memory system according to still yet another example embodiment of the inventive concept. Referring to FIG. 7, the memory system 300 may be implemented as a memory card or a smart card. The memory system 300 includes a memory device 40, a memory controller 20, and a card interface 320.

The memory controller 20 may control data exchanged between the memory device 40 and the card interface 320. The card interface 320 may be a secure digital (SD) card interface or a multi-media card (MMC) interface, but the embodiments are not restricted thereto.

The memory controller 20 analyzes read data RDATA received from the non-volatile memory device 40, determines whether charge loss has occurred or not according to the result of analysis, calculates charge loss amount $V_{loss}$ when it is determined that charge loss has occurred, and changes the erase count of the memory block that stores the read data RDATA.

The card interface 320 may interface data exchanged between a host HOST and the memory controller 20 according to a protocol of the host HOST. The card interface 320 may support an universal serial bus (USB) protocol and an interchip (IC)-USB protocol. Here, a card interface 320 may denote hardware capable of supporting the protocol the host HOST uses, a software mounted on the hardware, or a signal transmission method.

When the memory system 300 is connected to the host HOST, for example, PC, tablet PC, digital camera, digital audio player, mobile phone, console video game hardware, or digital set-top box, the host HOST may perform data communication with the non-volatile memory device 40 through the card interface 320 and the memory controller 20.

Figure 8:
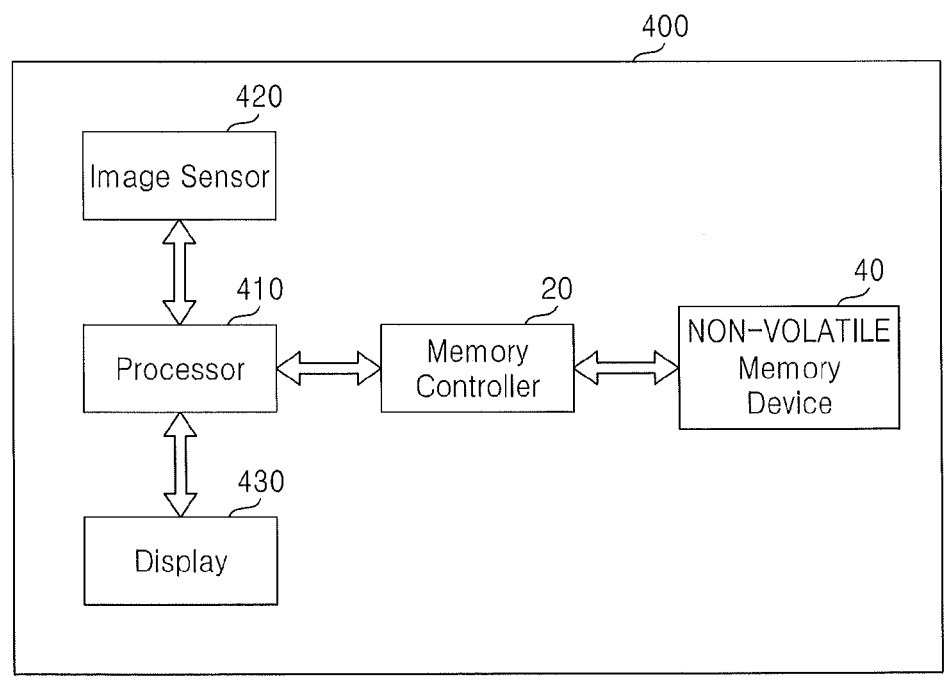
FIG. 8 is a block diagram of a memory system according to still yet another example embodiment of the inventive concept.

FIG. 8 is a block diagram of a memory system according to still yet another example embodiment of the inventive concepts. Referring to FIG. 8, the memory system 400 may be implemented as an image processing device, for example, a digital camera or a mobile phone including a digital camera.

The memory system 400 includes a non-volatile memory device 40 and a memory controller 20 capable of controlling the data processing operations of the non-volatile memory device 40, for example, a program operation, an erase operation, or a read operation.

An image sensor 420 of the memory system 400 converts an optical image into digital signals and transmits the converted digital signals to a processor 410 or the memory controller 20. The converted digital signals may be displayed through a display 430 or stored in the non-volatile memory device 40 through the memory controller 20 under the control of the processor 410.

Also, data stored in the non-volatile memory device 40 is displayed through the display 430 under the control of the memory controller 20. The memory controller 20 is configured to control operations of the non-volatile memory device 40 and may be embodied as a part of the processor 410 or separate from the processor 410.

Figure 9:
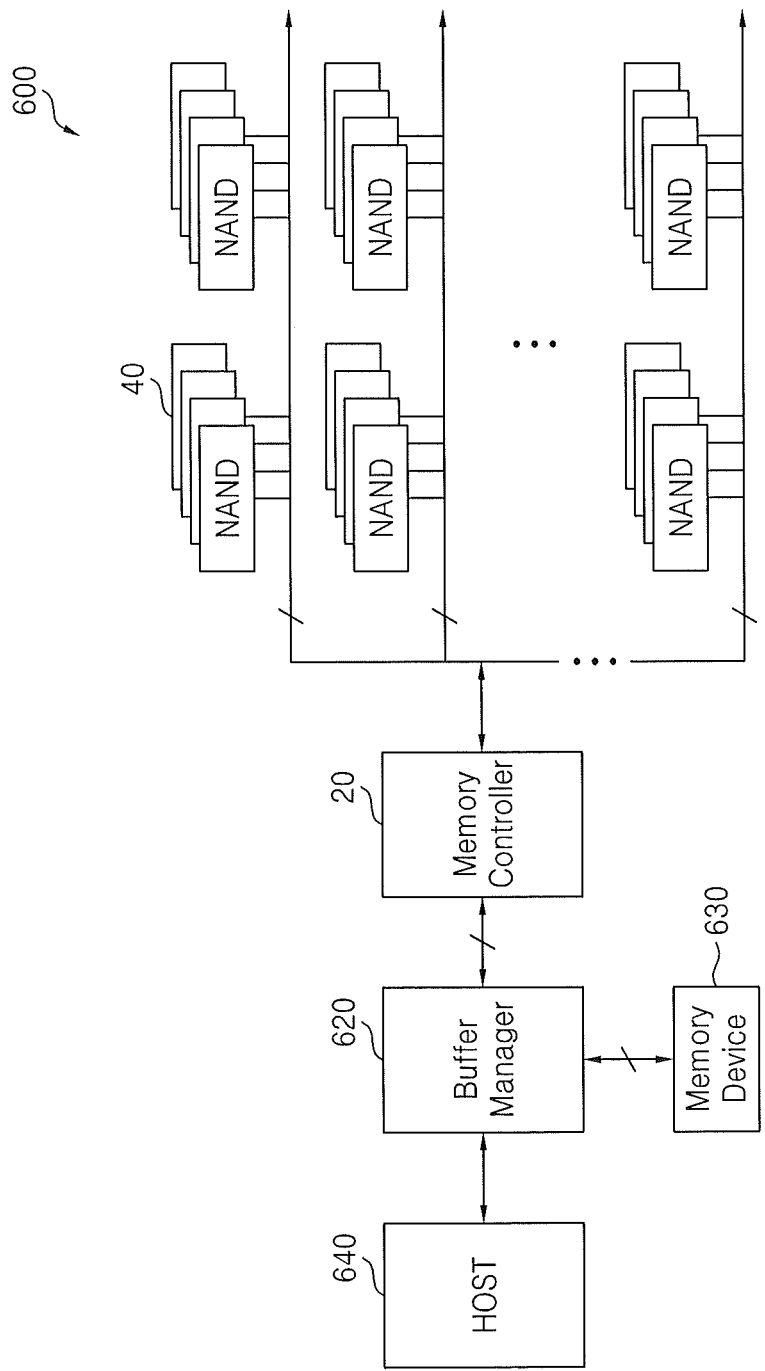
FIG. 9 is a block diagram of a memory system according to still yet another example embodiment of the inventive concept.

FIG. 9 is a block diagram of a memory system 600 according to still yet another example embodiment of the inventive concept. Referring to FIG. 9, the memory system 600 may be implemented as a data processing device such as a solid state drive (SSD). The memory system 600 includes a plurality of the non-volatile memory devices 40, the memory controller 20 for controlling the data processing operation of each of the plurality of non-volatile memory devices 40, a volatile memory device 630 (such as DRAM), a buffer manager 620 controlling the storage of data exchanged between the memory controller 20 and a host 640 in the volatile memory device 630.

The memory controller 20 analyzes read data RDATA received from the non-volatile memory devices 40, determines whether charge loss has occurred or not according to the result of analysis, calculates charge loss amount $V_{loss}$ when it is determined that charge loss has occurred, and changes the erase count of a memory block that stores the read data RDATA.

Figure 10:
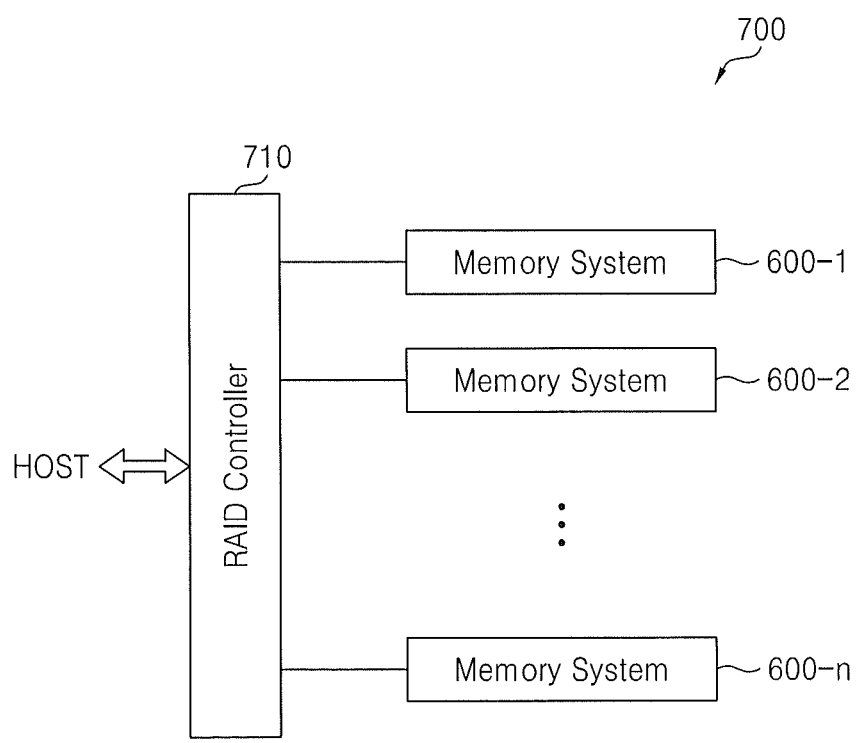
FIG. 10 is a block diagram of a data processing system including the memory system shown in FIG. 9.

FIG. 10 is a block diagram of a data processing system including the memory system shown in FIG. 9. Referring to FIGS. 9 and 10, a data processing device 700 which may be implemented as a redundant array of independent disks (RAID) system includes a RAID controller 710 and a plurality of memory systems 600-1~600-*n*, where the n is a natural number.

Each of the plurality of memory systems 600-1~600-n can be a memory system 600 shown in FIG. 9. The memory systems 600-1~600-n may compose a RAID array. The data processing device 700 may be implemented as personal computer (PC), network-attached storage (NAS) or solid state drive (SSD). Each of the memory systems 600-1~600-n may be a memory system embodied in the form of memory module.

The RAID controller 710 may output data from the host 640 into at least one electronic device of the plurality of memory systems 600-1~600-n based on the RAID level according to the program request output from the host 640 during program operation.

The RAID controller 710 may transmit data read from at least one memory system among the plurality of memory systems 600-1~600-n in response to a read command from the host 640.

Figure 11:
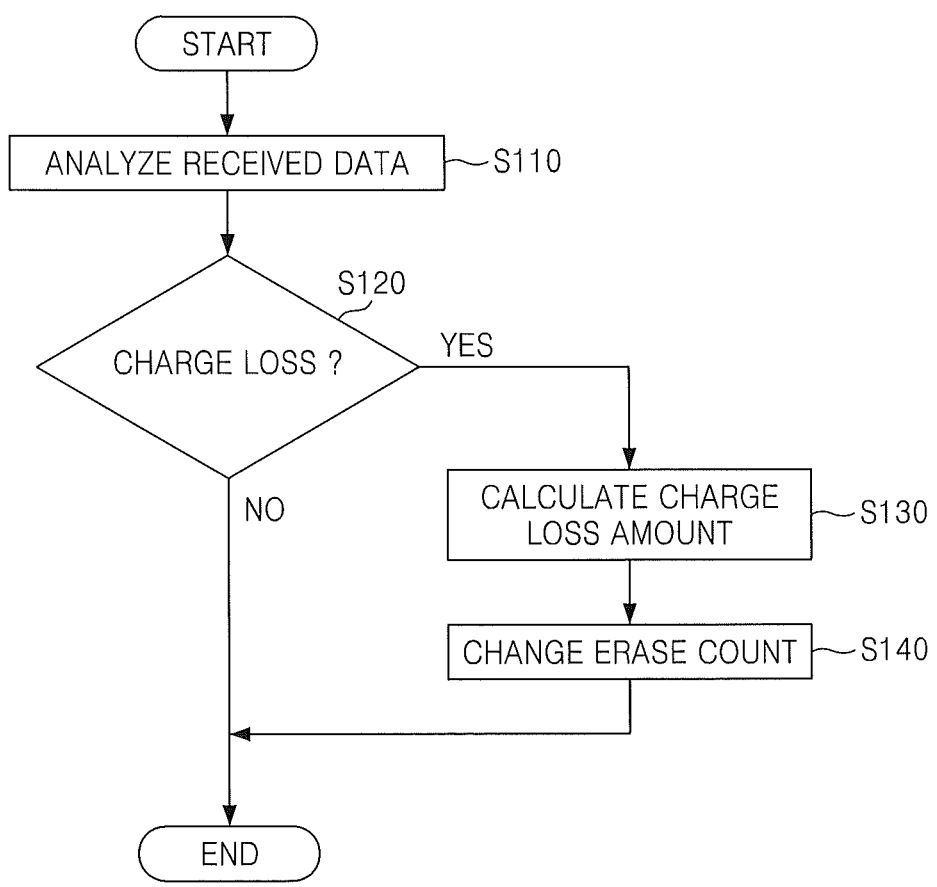
FIG. 11 is a flowchart illustrating methods of operating memory controllers according to an example embodiment of the inventive concept.

FIG. 11 is a flow chart for explaining methods of operating memory controllers according to an example embodiment of the inventive concept. Referring to FIGS. 1 and 11, the memory controller 20 analyzes read data RDATA received from a memory block 41 (S110) of the non-volatile memory device 40, for example, a page of the first memory block 41-1 and determines whether or not charge loss has occurred according to the analysis (S120).

The analysis of the received read data RDATA may be provided using an error correction code (ECC).

The memory controller 20 calculates charge loss amount (S130), when it is determined that charge loss has occurred (S120), and changes the erase count of the first memory block 41-1 according to the calculated charge loss amount (S140).

The charge loss amount $V_{loss}$ may be obtained by the difference between the default pass voltage R when the read fail occurs and the pass voltage R' adjusted until an errorless read occurs. In some embodiments according to the inventive concept, the read is performed until an acceptable number (e.g., correctable) of errors is detected.

The charge loss amount $V_{loss}$ may be obtained based on the number of 0 or 1 of memory cells of the page undergone the read fail.

The charge loss amount $V_{loss}$ may be obtained by comparing the patterns of the read data RDATA received from the page of the first memory block 41-1 of the non-volatile memory device to the data programmed to the page.

Figure 12:
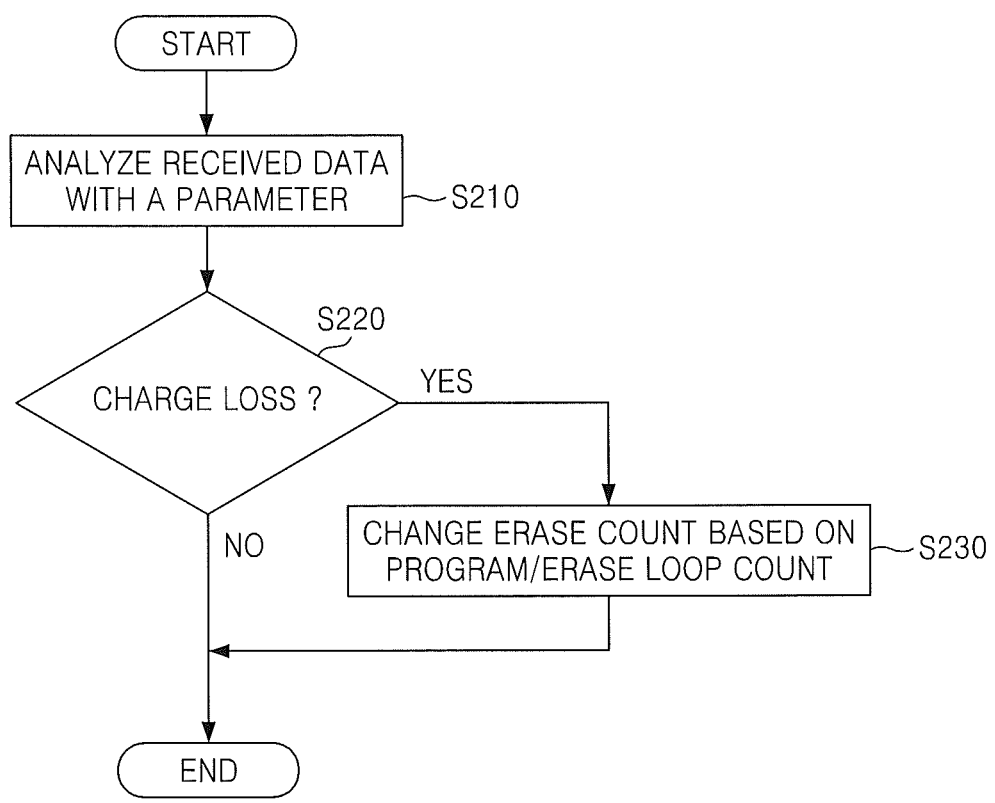
FIG. 12 is a flowchart illustrating methods of operating memory controller according to another example embodiment of the inventive concept.

FIG. 12 is a flow chart for explaining methods of operating a memory controller according to another example embodiment of the inventive concept. Referring to FIGS. 1 and 12, the memory controller 20 receives data PDATA including a parameter from the memory block 41 of the non-volatile memory device 40 and analyzes the received data of the non-volatile memory device 40 (S210).

When it is determined that charge loss has occurred (S220), the memory controller 20 changes erase count of the memory block (S230). The data PDATA including a parameter may include at least one of cell state of the non-volatile memory device 40, program loop count, erase loop count, error bit count, and erase count.

The memory controller 20 may store the data PDATA including the parameter in the memory block 41 of the non-volatile memory device 40, for example, in a spare region of the memory block 41.

The memory controller and the method of operating the same according to example embodiments of the inventive concepts may change the erase count of the memory block having undergone charge loss, thereby enabling the block to be erased more than actual erase count, so that the lifespan and reliability of the memory system may improve. Also, the actual erase count with respect to the present block may be retained, so that accuracy of methods for changing the distribution or correcting errors based on the erase count may be evaluated.

While the present invention has been particularly shown and described with reference to example embodiments thereof, it will be understood that various changes in form and details may be made therein without departing from the spirit and scope of the following claims.

What is claimed is:

1. A method for operating a memory controller comprising:
    receiving read data output from a memory block of a non-volatile memory device; and
    decreasing an erase count of the memory block based on the read data.

2. The method of claim 1, wherein decreasing the erase count includes determining whether or not charge loss has occurred by analyzing the read data, calculating charge loss amount when it is determined that charge loss has occurred, and decreasing the erase count of the memory block based on the calculated charge loss amount.

3. The method of claim 1, wherein when the read data includes a parameter, decreasing the erase count includes determining whether or not charge loss has occurred by analyzing the data including the parameter, and decreasing the erase count of the memory block when it is determined that charge loss has occurred.

4. The method of claim 3, wherein the read data including the parameter includes at least one of cell state of the non-volatile memory device, program loop count, erase loop count, error bit count, or erase count.

5. The method of claim 3, further comprising storing the read data including the parameter in a memory block of the non-volatile memory device.

6. The method of claim 1 wherein decreasing the erase count provides a decreased erase count, the method further comprising:
    storing information with respect to the decreased erase count in a memory included in the memory controller.

7. The method of claim 1, wherein decreasing the erase count provides a decreased erase count, the method further comprises:
    storing the information with respect to the changed erase count in the memory block of the non-volatile memory device, after the changing the erase count of the memory block.

8. A memory system comprising:
    a non-volatile memory device; and
    a memory controller configured to control operation of the non-volatile memory device, wherein the memory controller includes a control unit configured to receive read data output from a memory block of the non-volatile memory device and configured to decrease an erase count of the memory block based on errors in the read data.

9. The memory system of claim 8, wherein the memory controller decreases the erase count to provide a decreased erase count, and the memory controller is configured to store information associated with the decreased erase count in a memory included in the memory controller.

10. The memory system of claim 8, wherein the memory controller and the non-volatile memory device are embodied into one package.

11. The memory system of claim 8, the memory system is comprises a memory card or a solid state drive (SSD).

12. The memory system of claim 8, the memory controller outputs information associated with the decreased erase count to the non-volatile memory device to be stored in the non-volatile memory device.

13. A method for operating a memory controller comprising:
- reading a page of non-volatile memory using a pass voltage to provide read data;
- performing error check on the read data to determine a number of errors in the read data;
- reducing the pass voltage to provide a respective modified pass voltage used to re-read the page;
- determining whether the number of errors is acceptable to operate the non-volatile memory without reducing the pass voltage; and
- decreasing an erase count number associated with the page read based on an acceptable pass voltage,
- wherein the acceptable pass voltage is the pass voltage of which the number of errors is acceptable.

14. The method of claim 13 further comprising:
- determining a loss of charge associated with the page during the read thereof; and
- storing the acceptable pass voltage for use in reading the page in subsequent read operations to the page.

15. The method of claim 13 wherein decreasing the erase count number comprises decreasing a previous erase count number.

16. The method of claim 15 wherein decreasing the erase count number comprises decreasing the previous erase count number to allow the page to be accessed more times than originally specified.

17. The method of claim 13 wherein performing error check on the read data comprises:
- performing error detection and correction on the read data to determine the number of errors in the read data.

18. The method of claim 13 wherein performing error check on the read data comprises:
- comparing a detected number of data values included in the page during the read to a predetermined number of data values programmed to the page before the read.

19. The method of claim 18 further comprising:
- decreasing the erase count number if the detected number of data values varies from the predetermined number of data values; and
- maintaining the erase count number if the detected number of data values does not vary from the predetermined number of data values.

20. The method of claim 13 further comprising:
- maintaining the erase count number in the page of the non-volatile memory.

* * * * *